(12) United States Patent
Meyer

(10) Patent No.: US 7,754,977 B2
(45) Date of Patent: Jul. 13, 2010

(54) ELECTRONIC CONTROLLER FOR A MOTOR VEHICLE, IN PARTICULAR FOR A GEARBOX CONTROLLER

(75) Inventor: Martin Meyer, Sulzbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 11/916,259

(22) PCT Filed: May 4, 2006

(86) PCT No.: PCT/EP2006/062047

§ 371 (c)(1),
(2), (4) Date: Nov. 30, 2007

(87) PCT Pub. No.: WO2006/131428

PCT Pub. Date: Dec. 14, 2006

(65) Prior Publication Data

US 2008/0192445 A1     Aug. 14, 2008

(30) Foreign Application Priority Data

Jun. 8, 2005  (DE) .................. 20 2005 009 039 U

(51) Int. Cl.
*H05K 1/16* (2006.01)
(52) U.S. Cl. ..................................... 174/260
(58) Field of Classification Search ................. 174/260; 361/748; 310/52–54; 439/76.2, 76.1
See application file for complete search history.

(56) References Cited

U.S. PATENT DOCUMENTS

| | | | |
|---|---|---|---|
| 4,339,260 A * | 7/1982 | Johnson et al. ................ 65/160 |
| 5,878,630 A | 3/1999 | Fessler et al. ............. 74/606 A |
| 5,910,716 A * | 6/1999 | Olsen et al. ............ 318/400.01 |
| 6,156,970 A | 12/2000 | Harting et al. ............. 174/52.1 |
| 6,396,692 B1 | 5/2002 | Farshi et al. ................ 361/690 |
| 6,488,601 B1 | 12/2002 | Sommer et al. ............... 474/70 |
| 6,550,263 B2 * | 4/2003 | Patel et al. ................. 62/259.2 |
| 7,352,143 B2 * | 4/2008 | Inaba et al. ................. 318/139 |
| 2004/0035245 A1 | 2/2004 | Albert et al. .................. 74/606 |
| 2004/0150271 A1 | 8/2004 | Koga et al. .................... 310/64 |
| 2005/0002162 A1 | 1/2005 | Beihoff et al. ............. 361/689 |

FOREIGN PATENT DOCUMENTS

| | | |
|---|---|---|
| DE | 4311518 | 4/1993 |
| DE | 19517491 | 5/1995 |
| DE | 19645635 | 11/1996 |

(Continued)

OTHER PUBLICATIONS

International Search Report; PCT/EP2006/062047; pp . 5, Jun. 8, 2005.
International Search Report, PCT/EP2006/062047; pp . 6, May 4, 2006.

*Primary Examiner*—Jinhee J Lee
*Assistant Examiner*—Abiy Getachew
(74) *Attorney, Agent, or Firm*—King & Spalding L.L.P.

(57) ABSTRACT

An electronic controller for a motor vehicle, in particular for a gearbox controller, which is arranged in or on a drive train, has a printed circuit board (17) which is arranged in a housing (13, 14) and is fitted with electronic components, with an electronic heat-protection barrier (22) being arranged between the printed circuit board (17) and the housing (13, 14).

14 Claims, 3 Drawing Sheets

FOREIGN PATENT DOCUMENTS

| | | |
|---|---|---|
| DE | 19710931 | 3/1997 |
| DE | 19812042 | 3/1998 |
| DE | 19958189 | 12/1999 |
| DE | 10239634 | 8/2002 |
| EP | 1054192 | 5/2000 |
| JP | 2002353656 | 6/2002 |
| WO | 2004085209 | 10/2004 |

\* cited by examiner

ELECTRONIC CONTROLLER FOR A MOTOR VEHICLE, IN PARTICULAR FOR A GEARBOX CONTROLLER

CROSS-REFERENCE TO RELATED APPLICATIONS

This application is a U.S. national stage application of International Application No. PCT/EP2006/062047 filed May 4, 2006, which designates the United States of America, and claims priority to German application number 20 2005 009 039.5 filed Jun. 8, 2005, the contents of which are hereby incorporated by reference in their entirety.

TECHNICAL FIELD

The invention relates to an electronic controller for a motor vehicle, in particular for a transmission controller, which is arranged in or on a drive train, composed of a printed circuit board which is arranged in a housing and which is fitted with electronic components.

BACKGROUND

DE 102 39 634 A1 discloses an electronic control device which is arranged in the drive train of a motor vehicle between an internal combustion engine and a transmission in a housing bell. However, since a high temperature is produced in the interior of the housing bell as a result of the heat of the internal combustion engine and as a result of the heat of actuators and said temperature could destroy the electronic components of the control device, cooling with compressed air is provided. For this purpose, the controller is arranged in an air bypass and the compressed air which is used to activate the actuator flows around it. Since this cooling is not sufficient, a Peltier element is additionally arranged on the controller, the cold side of which Peltier element faces the controller and as a result cools the electronic components. Furthermore, cooling fins are also formed on the controller.

Despite these measures for cooling, failures of these electronic components occur since such components are not configured for such extremely high continuous temperatures.

SUMMARY

According to an embodiment, a controller may withstand even an extremely high temperature level at the place of installation and ensures reliable functioning of the electronics. To this end, an electronic controller for a motor vehicle which is arranged in or on a drive train, may comprise a printed circuit board which is arranged in a housing and which is fitted with electronic components, and an electronic heat protection barrier arranged between the printed circuit board and the housing.

According to another embodiment, the heat protection barrier can be embodied as a cooling element in which a coolant is conducted. According to another embodiment, the coolant may be compressed air. According to another embodiment, the cooling element can be of tubular design and may be connected to a coolant reservoir via a coolant inlet. According to another embodiment, the coolant inlet can be embodied as a valve, wherein the valve is connected to an electronic system which controls the entry of coolant as a function of the internal temperature of the housing. According to another embodiment, the coolant inlet can be actuated by a valve which is connected to the electronic system which controls the entry of coolant as a function of the internal temperature of the housing. According to another embodiment, a coolant outlet can be arranged on the housing. According to another embodiment, a heat-conducting film can be arranged between the cooling element and the printed circuit board. According to another embodiment, the controller may have a common outer casing with the drive train. According to another embodiment, the electronic heat protection barrier may surround the printed circuit board on both sides. According to another embodiment, the controller can be a transmission controller.

BRIEF DESCRIPTION OF THE DRAWINGS

The invention permits numerous embodiment possibilities. One of these will be explained in more detail with reference to the figure which is illustrated in the drawing. In said drawing.

DETAILED DESCRIPTION

As stated above, according to various embodiments, an electronic heat protection barrier can be arranged between the printed circuit board and the housing.

The various embodiments have the advantage that the cooling may take place directly in the vicinity of the electronic components themselves. The heat barrier which can be arranged in the housing itself ensures that the heat which penetrates the controller from the surroundings is carried away immediately, and does not even act on the components. In this way it is easily possible to ensure the operating temperature of the electronic components.

Thus, the functioning of the electronics of the controller at continuous temperatures up to 130° C. and peak temperatures up to 150° C. without system failure can be ensured.

According to another embodiment, the heat protection barrier is embodied as a cooling element in which a coolant is conducted. The heat which is absorbed from the outside is carried away immediately out of the housing of the controller by the conduction of the coolant.

This is particularly easy to ensure if the coolant is compressed air.

By virtue of the fact that the cooling element is of tubular design and is connected to a coolant reservoir via a coolant inlet, the heated coolant is carried away and relatively cool coolant is subsequently fed in from the reservoir.

In order to be able to switch the cooling on and off as required, the coolant inlet is embodied as a valve, with the valve being connected to an electronic system which controls the entry of coolant as a function of the internal temperature of the housing.

Alternatively, the coolant inlet can be actuated with a valve which is connected to the electronic system which controls the entry of coolant as a function of the internal temperature of the housing.

According to another embodiment, a coolant outlet is arranged on the housing. The coolant is conducted here from the coolant inlet via the cooling element through the housing and from here is discharged to the surroundings.

The cooling system can advantageously be a compressed air system, a hydraulic system or a fuel system.

According to another embodiment, a heat-conducting plastic film can be arranged between the cooling element and the printed circuit board. Such a plastic film contributes additionally to keeping the temperature of the surroundings away from the electronics.

Owing to the electronic heat protection barrier which is arranged in the controller itself, it is possible for the controller to have a common outer casing with the drive train. This outer casing serves to reduce the noise level, but on the other hand prevents heat from being carried away through the housing.

In order to increase the thermal protection within the controller, the electronic heat protection barrier surrounds the printed circuit board on both sides.

Figure 1:
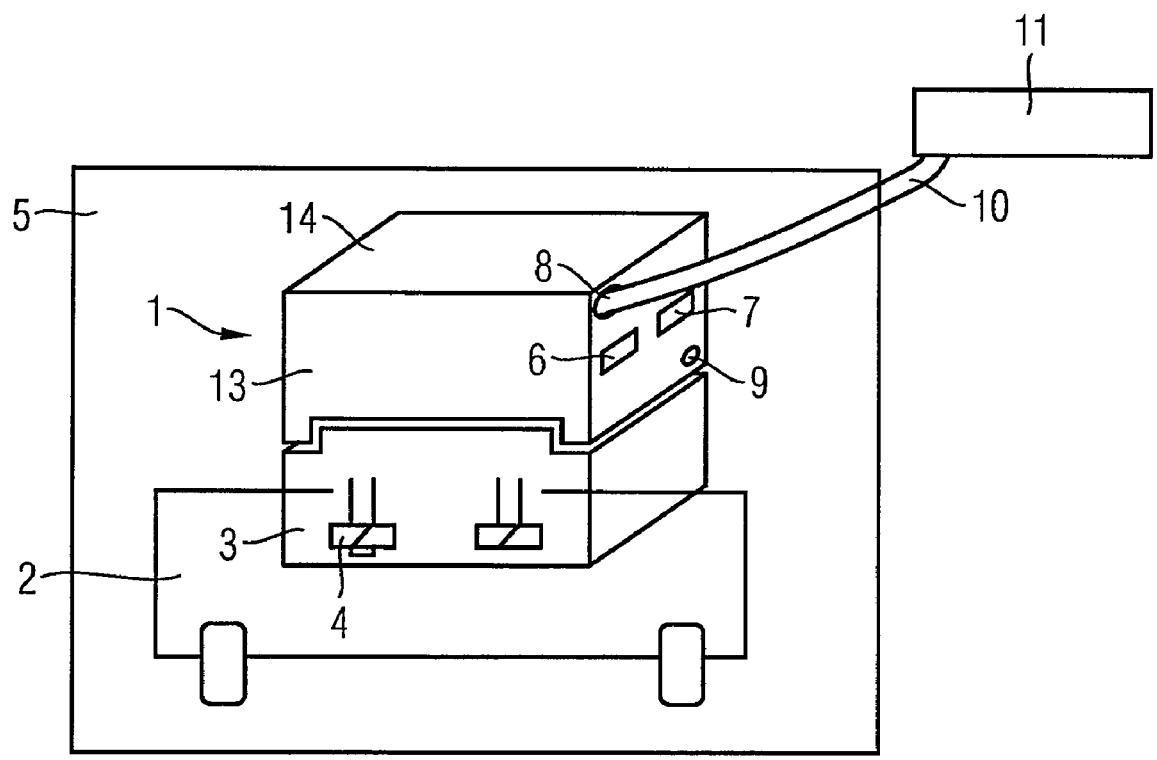
FIG. 1 shows a transmission controller on the transmission of the motor vehicle.

In FIG. 1, the transmission controller 1 is arranged on the transmission 2 of a drive train (not illustrated in more detail) of a motor vehicle. The drive train includes the internal combustion engine, the clutch, the transmission and/or a retarder, it being possible for the controller 1 to also be arranged on these assemblies.

The transmission 2 has an actuator block 3 with actuators 4, with the controller 2 being mounted on the actuator block 3. The controller 1, the transmission 2 and the actuator block 3 are surrounded by an outer casing 5 for reasons of noise protection.

The transmission controller 1 has, in addition to two plug connectors 6 and 7, an air inlet valve 8 and an air outlet valve 9. The air inlet valve 8 is connected to a compressed air reservoir 11 via a compressed air line 10.

Figure 2:
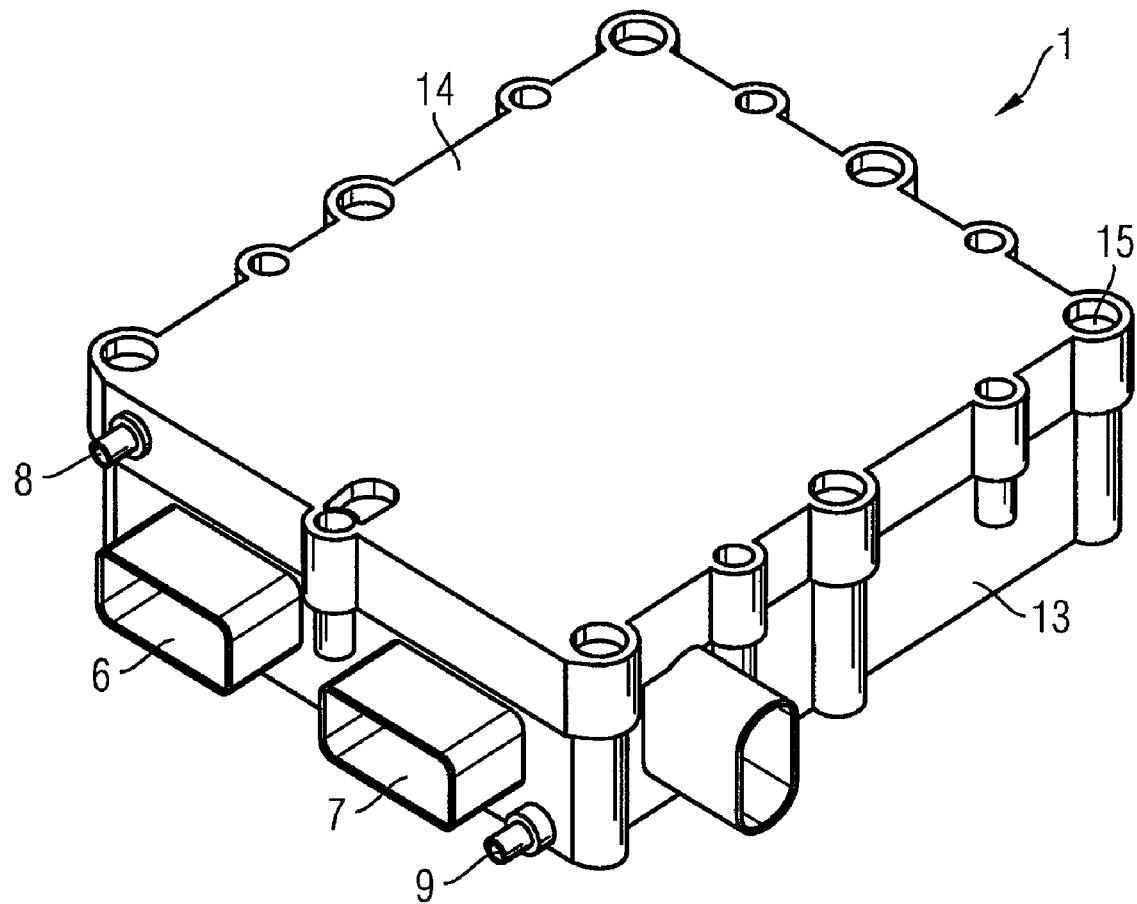
FIG. 2 shows the transmission controller in the closed state.

FIG. 2 illustrates the transmission controller in the closed state. Here too, the compressed air inlet valve 8 and a compressed air outlet element 9 can be seen. Here, the housing is embodied in two parts and is composed of a plastic base body 13, which is covered by a plastic upper part 14. The base body 13 and the cover 14 are connected to one another by means of a plurality of screw connections 15.

Figure 3:
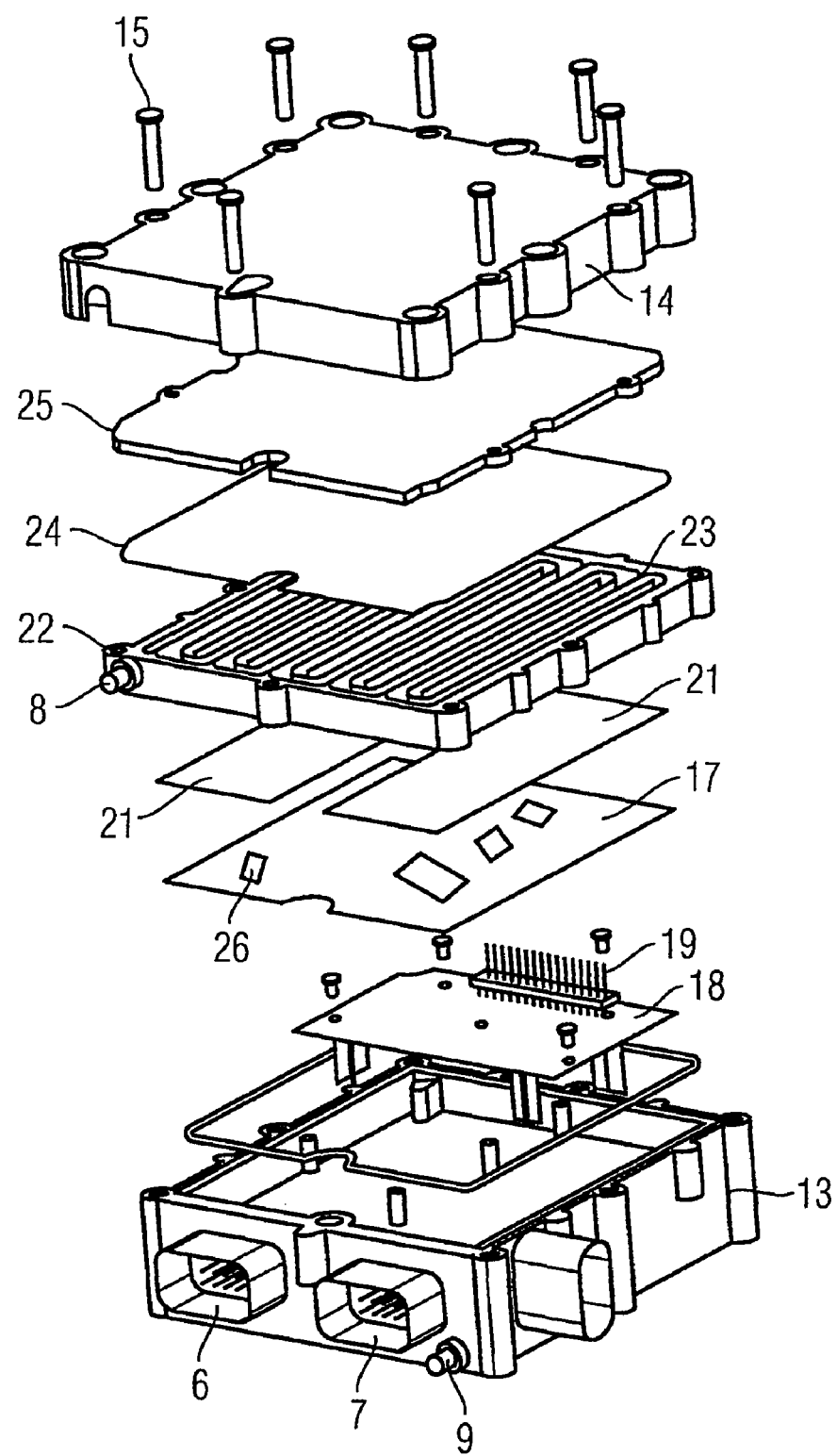
FIG. 3 is an exploded view of the transmission controller.

According to FIG. 3, a printed circuit board 17, which is fitted with electronics, is inserted into the base body 13. The printed circuit board 17 is connected via a connecting element 19, in the form of a plug, to a further printed circuit board 18 which is fitted with electrics and which is in contact with the valves 8, 9. A cooling element 22 which is composed of aluminum and whose pipes 23 which conduct coolant are laid in a meandering shape adjoins a coldness conducting film 21.

This cooling element 22 is adjoined by a seal 24 and a heat shield 25. The cooling element 22 is screwed to the base body 13 and the cover 14 by means of screws 15 during mounting in order to form one structural unit.

The compressed air inlet valve 8 is arranged here on the cooling element 22 and the air outlet element 9 on the carrier body 13.

The compressed air is conducted through the inlet valve 8 via the meandering cooling coils 23 of the cooling element 22 and flows through openings (not illustrated in more detail) in the cooling element 22 and the electronics 17 and leaves the housing via the air outlet element 9 in the base body 13.

This cooling system permits the controller 1 to be cooled by the aluminum cooling element 22 with compressed air of a compressed air system which is present per se in the vehicle. The meandering cooling coils 23 of the cooling element 22 ensure a sufficient drop in temperature from the surroundings to the electronics. The plastic film 21 amplifies this temperature gradient by transmitting the cooling power from the cooling element 22 to the electronics.

The current temperature of the electronics is measured internally by means of a temperature sensor 26 and is analyzed at a microcontroller which is also located on the printed circuit board 17. This microcontroller decides whether the valve 8 is actuated. This control permits a reduction in energy since the compressed air is fed into the cooling body 22 only when the temperature conditions within the controller 1 require it in order to maintain the method of functioning of the electronic components.

What is claimed is:

1. An electronic controller for a motor vehicle which is arranged in or on a drive train, comprising a printed circuit board which is arranged in a housing and which is fitted with electronic components, and an electronic heat protection barrier arranged between the printed circuit board and the housing and embodied as a cooling element in which a coolant is conducted;

wherein the cooling element is connected to a coolant reservoir via a coolant inlet embodied as or actuated by a valve connected to an electronic system, and wherein the electronic system automatically controls the valve to control entry of coolant into the cooling element as a function of the internal temperature of the housing.

2. The controller according to claim 1, wherein the coolant is compressed air.

3. The controller according to claim 1, wherein the cooling element is of tubular design.

4. The controller according to claim 1, wherein a coolant outlet is arranged on the housing.

5. The controller according to claim 1, wherein a heat-conducting film is arranged between the cooling element and the printed circuit board.

6. The controller according to claim 1, wherein said controller has a common outer casing with the drive train.

7. The controller according to claim 1, wherein the electronic heat protection barrier surrounds the printed circuit board on both sides.

8. The controller according to claim 1, wherein the controller is a transmission controller.

9. An electronic transmission controller for a motor vehicle, comprising:

a housing, a printed circuit board which is arranged in the housing, electronic components arranged on said printed circuit board, an electronic heat protection barrier arranged between the printed circuit board and the housing and embodied as a cooling element in which a coolant is conducted, the cooling element being connected to a coolant reservoir via a coolant inlet embodied as or actuated by a valve; and an electronic system configured to automatically control the valve to control entry of coolant into the cooling element as a function of the internal temperature of the housing.

10. The transmission controller according to claim 9, wherein the coolant is compressed air.

11. The transmission controller according to claim 9, wherein the cooling element is of tubular design.

12. The transmission controller according to claim 9, wherein a heat-conducting film is arranged between the cooling element and the printed circuit board.

13. The transmission controller according to claim 9, wherein said controller has a common outer casing with the drive train.

14. The transmission controller according to claim 9, wherein the electronic heat protection barrier surrounds the printed circuit board on both sides.

* * * * *